United States Patent [19]
Andresen et al.

[11] Patent Number: 5,764,077
[45] Date of Patent: Jun. 9, 1998

[54] 5 VOLT TOLERANT I/O BUFFER CIRCUIT

[75] Inventors: Bernhard Hans Andresen, Dallas; Daniel Edmonson, Allen, both of Tex.

[73] Assignee: Texas Instruments Incorporated, Dallas, Tex.

[21] Appl. No.: 597,889

[22] Filed: Feb. 5, 1996

[51] Int. Cl.$^6$ ............................. H03K 17/16; H03K 19/00
[52] U.S. Cl. ............................. 326/34; 326/83; 326/58
[58] Field of Search ............................. 326/58, 83, 33, 326/34

[56] References Cited

U.S. PATENT DOCUMENTS

| | | |
|---|---|---|
| 3,995,171 | 11/1976 | Sonoda ............................. 326/83 |
| 5,144,165 | 9/1992 | Dhong et al. . |
| 5,151,619 | 9/1992 | Austin et al. . |
| 5,160,855 | 11/1992 | Dobberpuhl . |
| 5,206,544 | 4/1993 | Chen et al. . |
| 5,243,236 | 9/1993 | McDaniel . |
| 5,304,872 | 4/1994 | Avraham et al. . |
| 5,381,059 | 1/1995 | Douglas . |
| 5,406,140 | 4/1995 | Wert et al. ............................. 326/81 |
| 5,418,476 | 5/1995 | Strauss . |
| 5,534,795 | 7/1996 | Wert et al. ............................. 326/83 |
| 5,552,719 | 9/1996 | Murakami ............................. 326/83 |
| 5,576,635 | 11/1996 | Partovi et al. ............................. 326/83 |
| 5,629,634 | 5/1997 | Carl et al. ............................. 326/83 |

OTHER PUBLICATIONS

IBM Technical Disclosure Bulletin, "Performance–Controlled CMOS Driver for Multi–Voltage Interfaces", vol. 33, No. 3A, pp. 445–446, Aug. 1990.

*Primary Examiner*—Edward P. Westin
*Assistant Examiner*—Richard Roseen
*Attorney, Agent, or Firm*—Robby T. Holland; Wade James Brady; Richard L. Donaldson

[57] ABSTRACT

An output buffer includes a pair of P-channel transistors and two cascode pull-down N-channel transistors to drive an output node. The output pull-up transistor has the gate thereof connected through a P-channel control transistor to an input driving signal. The control signal is isolated from the output node by a P-channel transistor which only conducts during overvoltage conditions. During normal operation, the control transistor is maintained in a conductive state to allow the gate of the output pull-up transistor to be pulled high and low. During an overvoltage condition, the P-channel transistor connected between the output node and the control transistor is turned on in order to effectively turn off the control transistor. The P-channel transistors in the output buffer are floating well-type transistors with the wells thereof tied to a switched voltage that is either the supply voltage during the normal operating mode or the output node during overvoltage conditions.

2 Claims, 2 Drawing Sheets

5 VOLT TOLERANT I/O BUFFER CIRCUIT

BACKGROUND OF THE INVENTION

As semiconductor integrated circuits (ICs) have increased in density, the power supply voltage levels provided thereto have been correspondently reduced to reduce the deleterious effects of voltage differentials across increasingly smaller device dimensions. In the early days of semiconductor devices, the voltage levels were approximately +/–12 volts. In the mid 1970s, the voltage level was reduced to 5 volts with only a single voltage level required. Of recent change, is the change from a nominal 5 volt value to a 3.3 volt value. However, this change in voltage has not occurred on all parts, such that the semiconductor parts are now mixed and, therefore, there is a requirement for 3.3 volt devices to communicate with 5.0 volt devices. This therefore requires a chip designer to accommodate a higher than operating voltage level on an output pin, i.e., a 3.3 volt part must be able to tolerate a 5.0 volt level. This is even further exacerbated in situations utilizing a PCI bus, wherein the voltage can even rise up to a single diode drop above the 5.0 volt level.

One of the problems that exists when operating a 3.3 volt part in a 5.0 volt environment is that the transistors in the 3.3 volt part are designed with gate oxide layers that will not tolerate a full 5.0 volt level between the inversion layer and gate. Therefore, a conventional output driver consisting of a pull-up P-channel transistor and a pull-down N-channel transistor could result in a full 5.0 volt level across the drain and gate of the N-channel transistor, thus degrading the long term operation and reliability thereof. This problem is commonly solved by adding a cascode transistor in series with the N-channel pull-down transistor and connecting the gate thereof to the $V_{DD}$. Another problem is the problem with respect to the N-well in which the P-channel transistors are typically fabricated. The well itself is typically tied to $V_{DD}$ which, when operating under a 3.3 volt output limit, is sufficient. Whenever the voltage rises above that level, the source/drain-to-well PN junction will be forward biased and current will be drawn from the output pad to the 3.3 volt supply pad. This has typically been solved by having a "floating well", which is switched between the 3.3 volt level and the 5.0 volt level, depending upon the output voltage on the output pad.

A third problem that exists is that, during a hiZ condition in a 3-state operation, the P-channel pull-up transistor can turn on whenever the output voltage goes to 5.0 volts. This problem was described in U.S. Pat. No. 5,160,855, issued to Dobberpuhl on Nov. 3, 1992, which patent is incorporated herein by reference. The buffer described in Dobberpuhl utilized circuitry for insuring that the P-channel pull-up transistor was not turned on whenever the output voltage exceeded the 3.3 volt power supply level. However, the circuit of Dobberpuhl did not completely maintain the P-channel pull-up transistor off in all conditions and, therefore, there remained certain conditions that would result in current spikes and leakage currents, raising the power level of the circuit.

SUMMARY OF THE INVENTION

The present invention disclosed and claimed herein comprises an output buffer having an input terminal and an output terminal and operating at a first supply voltage level. The output terminal is capable of tolerating voltages at a second and higher supply voltage level. The output buffer includes a positive power supply rail connected to the first supply voltage level and a negative power supply rail connected to a ground reference voltage level. A pull-down transistor is provided having a source/drain and gate of a first conductivity type for sinking current from the output terminal to the negative power supply rail through the source/drain path thereof in response to a first logic state on the input terminal. A pull-up transistor is provided having a source/drain and gate of a second conductivity type opposite the first conductivity type for sourcing current from the positive power supply rail to the output terminal through the source/drain path thereof in response to a second logic state on the input terminal. Input logic circuitry is operable to connect to the input terminal and generate a high driving signal and a low driving signal. The high driving signal controls the gate of the pull-up transistor and the low driving signal controls the gate of the pull-down transistor. In the normal operating mode, the high driving signal and the low driving signal are operable to change the logic state of the output terminal. A pass gate is provided for connecting the high driving signal to the gate of the pull-up transistor during a conductive mode and disconnecting it during a non-conductive mode. The pass gate is controlled to operate in the conductive mode when the voltage on the output terminal is at or between the ground reference voltage level and the first supply voltage level. Overvoltage circuitry is provided for pulling the gate of the pull-up transistor to substantially the second supply voltage level when the output terminal is in an overvoltage condition. In this overvoltage condition, the pass gate is operated in the non-conductive mode.

In another aspect of the present invention, the pass gate includes at least a single pass gate transistor having a source/drain and gate of a second conductivity type connected in series between the input logic circuitry and the gate of the pull-up transistor. This pass gate transistor selectively connects the high driving signal to the gate of the pull-up transistor.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
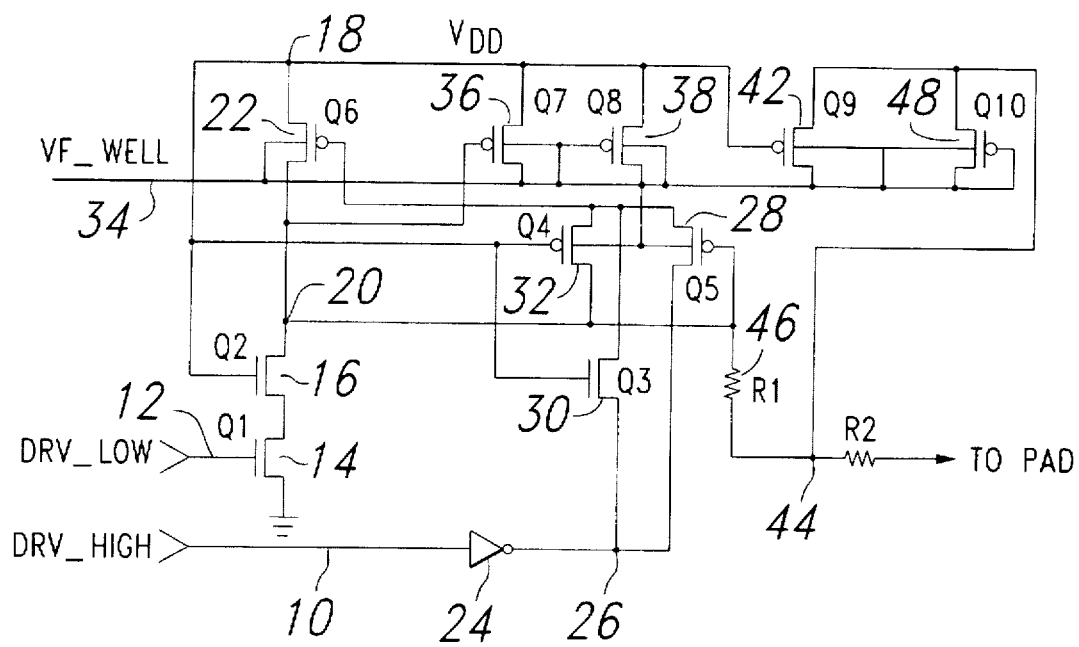
FIG. 1 illustrates a prior art output buffer circuit.

Referring now to FIG. 1, there is illustrated a prior art output buffer circuit, which incorporates the teachings of U.S. Pat. No. 5,160,855, issued to Dobberpuhl, described hereinabove and incorporated herein by reference. The output buffer receives two inputs, a high input drive signal on a line 10 labeled DRV_HIGH and a low driving signal on a line 12, labeled DRV_LOW. The low driving signal drives an N-channel transistor 14 labeled "Q1", the source/drain path thereof connected on one side to ground and on the other side to one side of the source/drain path of an N-channel transistor 16, labeled "Q2". The gate of transistor 16 is connected to a power supply node 18 labeled $V_{DD}$. This is a 3.3 volt level in the present embodiment. The transistor 16 is in a cascode configuration with the N-channel transistor 14. The other side of the source/drain path of transistor 16 is connected to an output node 20, output node 20 connected to one side of the source/drain path of a pull-up P-channel transistor 22 labeled "Q6". The other side of the source/drain path of transistor 22 is connected to the power supply node 18.

The driving signal for the gate of the pull-up transistor 22 is provided by the high driving signal on line 10. This signal is input through an inverter 24 to a node 26, node 26 connected to one side of the source/drain path of a P-channel transistor 28, the other side thereof connected to the gate of pull-up transistor 22. Transistor 28 is labeled "Q5". The gate of transistor 28 is connected to the output node 20. Transistor 28 has disposed in parallel therewith the source/drain path of an N-channel transistor 30 having the gate thereof connected to the power supply node and labeled "Q3". A P-channel transistor 32 has the source/drain path thereof connected between the gate of transistor 22 and the output node 20, and is labeled "Q4".

It can be seen that whenever the system is in a normal operating mode and the high driving signal is low and the low driving signal is high, this turns on transistor 14, pulling node 20 down, which turns on transistor 28. When transistor 28 is turned on, the gate of transistor 22 will be pulled high, turning transistor 22 off. In the opposite logic state, the low driving signal on line 12 will go low turning off transistor 14 and the high driving signal on line 10 will go high, pulling node 26 low to turn on transistor 22.

In operation, if the output voltage on node 20 is less than $V_{DD}$, then transistor 32 is cut off and the voltage on node 26 constitutes the gate voltage on transistor 22. However, if the output voltage is greater than $V_{DD}$, then transistor 32 will conduct and the voltage on the gate of transistor 22 will be the voltage on node 20. When the voltage on node 26 is low, transistor 30 is conducting and the gate of transistor 22 will be brought low to 0.0 volts. This will cause the output voltage on node 20 to go to $V_{DD}$ and, therefore, transistors 28 and 32 will be off. Alternatively, when node 26 is high, the output may be disposed at any voltage from 0.0 voltage to 5.0 volts, depending on the conditions external to the output driver stage.

Each of the P-channel transistors 22, 28 and 32 are "floating well" transistors, which have the well thereof connected to a floating well voltage node 34 (VF-WELL). A P-channel transistor 36 and the P-channel transistor 38 each have the source/drain paths thereof connected between the power supply node 18 and the floating well node 34. The gate of transistor 38 is connected to the floating well node 34 and the gate of transistor 36 is connected to the output node 20. Therefore, whenever the output node 20 is pulled low, the voltage $V_{DD}$ will be connected to the floating well node 34. Whenever the output voltage is above $V_{DD}$, transistor 36 will be turned off. Transistors 36 and 38 are labeled "Q7" and "Q8", respectively.

A P-channel transistor 42 labeled "Q9" has the source/drain path thereof connected between a node 44 and the floating well voltage node 34. Node 44 is connected to one side of a resistor 46 and the output node 20, resistor 46 labeled "R1". The gate of transistor 42 is connected to the $V_{DD}$ voltage level. The well of transistor 42 is connected to the floating well voltage node 34. A P-channel transistor 48 has the source/drain path thereof connected between node 44 and the floating well node 34 and the gate thereof connected to the floating well node 34. The transistor 48 is a floating well transistor with the floating well thereof connected to the floating well voltage node 34. Transistor 42 will be turned on whenever the node 44 rises above $V_{DD}$, such that the voltage on node 44 will be applied to the floating well voltage node 34. Transistor 48 will also be turned on under these conditions. At the same time, transistor 36 will be turned off and transistor 38 will be turned off.

In the situation where a hiZ signal is present (DRV_LOW and DRV_HIGH), and the current state of the output is $V_{DD}$, i.e., transistor 22 was previously on, all of the floating well switch transistors 36, 38, 42 and 48 will be turned off. This is an undesirable condition due to the fact that well leakage could pull the output down far enough to forward bias the well-pmoat junctions. When this happens, $h_{FE}$ multiplied by the leakage current will be dumped into the substrate through the pmoat (emitter)/well(base)/substrate (collector) parasitic transistors. The second problem that exists with the output buffer of FIG. 1 is turning off the output transistor 22. The gate of the output of transistor 22 in normal operation is controlled by the DRV_HIGH signal coupled through the transmission gate comprised of the transistors 28 and 30. The transistor 32 controls the gate when the pad is at 5 volts, which can only happen in the hiZ state. In the condition where the output is hiZ, and the level is 3.0 volts on the output of 20, then transistor 30, transistor 32 and transistor 28 are all off. This will allow the gate of transistor 22 to "float". With nothing to hold it high, the gate voltage of transistor 22 could droop to where it would conduct a sufficient amount to increase the output leakage current from the power supply node 18 to the output node 20. Additionally, under the condition of an output logic "1" to logic "0" transition in normal operation, transistor 28 is shut off until the output approaches the logic "0" state and transistor 30 cannot fully turn off transistor 22. This slows down how fast transistor 22 will turn off, which increases the power supply current spikes which, in turn, increase the switching noise.

Figure 2:
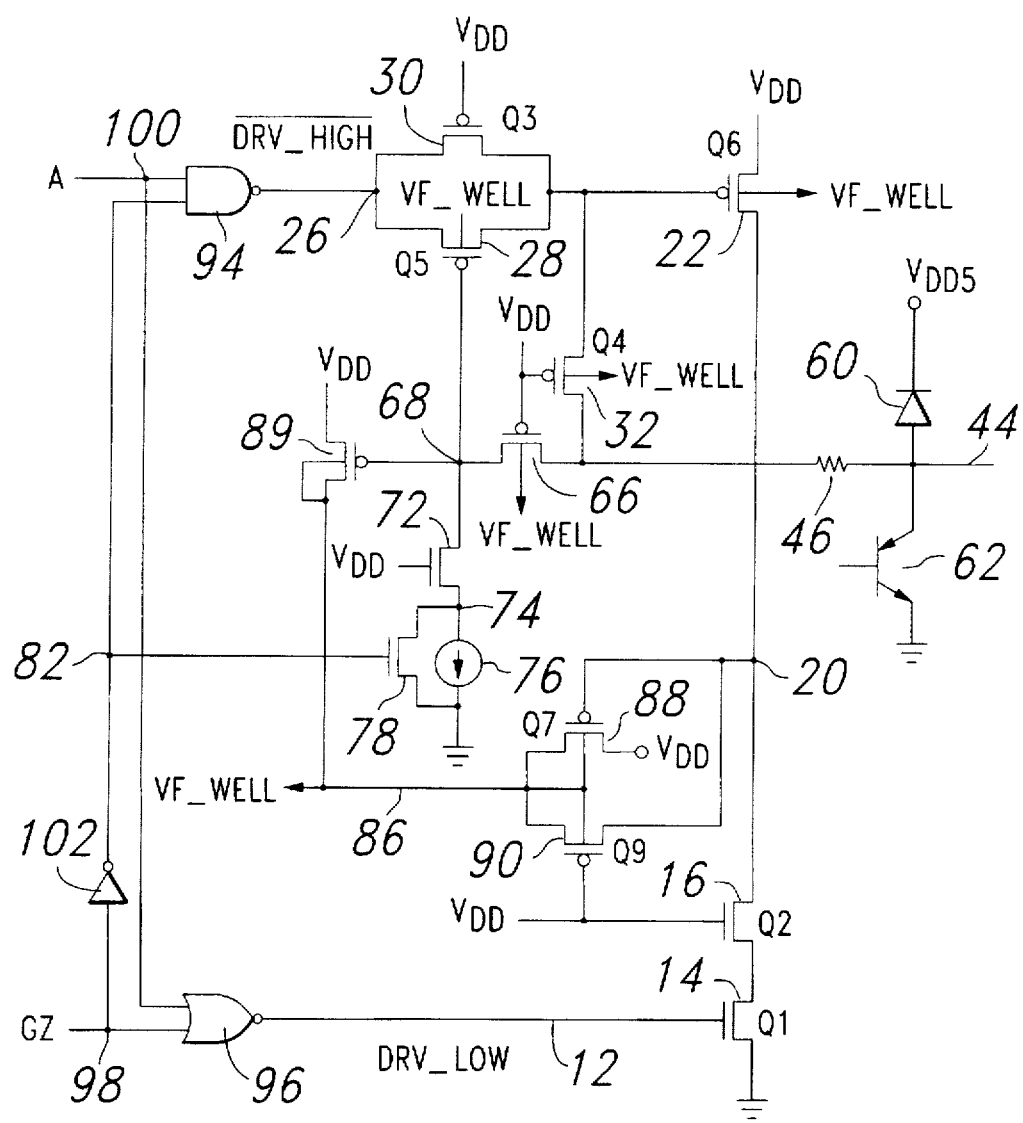
FIG. 2 illustrates the output buffer circuit of the present invention.

Referring now to FIG. 2, there is illustrated a schematic diagram of the preferred embodiment of the output buffer of the present invention. Like parts between FIG. 1 and FIG. 2 utilize the same reference numerals and the same designations. For example, transistors 14 and 16 are the same and are disposed between the output node 20 and ground. The pull-up transistor 22 is connected between the node 20 and $V_{DD}$, with the gate thereof connected to one side of the source/drain path of the two parallel connected transistors 28 and 30, the other side thereof connected to the node 26. The transistor 32 labeled "Q4" is connected between the gate of transistor 22 and the node 20. The gate of transistor 32 is connected to $V_{DD}$. The resistor 46 is connected between the node 20 and the node 44, with an electrostatic protection device (60,62) disposed on node 44.

One primary difference between the prior art structure and the embodiment of FIG. 2 is the inclusion of a P-channel transistor 66 having the source/drain path thereof connected between the node 20 and a node 68, with the gate of transistor 66 connected to $V_{DD}$. As such, transistor 66 now isolates the gate of transistor 28 from the node 20. The node 68 is connected to one side of the source/drain path of an N-channel transistor 72, the other side thereof connected to a node 74, the gate of transistor 72 connected to $V_{DD}$. Node 74 is connected to one side of a current source 76, the other side thereof connected to ground. Node 74 is also connected to one side of the source/drain path of an N-channel transistor 78, the other side thereof connected to ground. The gate of N-channel transistor 78 is connected to a node 82. The node 68 also drives the gate of the P-channel transistor 89, the source/drain path thereof connected between $V_{DD}$ and a floating well voltage node 86, similar to the floating well voltage node 34 of FIG. 1. The P-channel transistors 22, 28, 32, 66, 88, 89 and 90 all have the wells thereof connected to the node 86.

The node 86 is a switched node which is either connected to the output node 20 or to $V_{DD}$. This is facilitated with a P-channel transistor 88 having the source/drain path thereof connected between $V_{DD}$ and the node 86 and the gate thereof connected to the node 20, the N-well thereof connected to the N-well voltage node 86. A P-channel transistor 90 has the source/drain path thereof connected between the output node 20 and the N-well voltage node 86, the gate thereof connected to $V_{DD}$ and the well thereof connected to the N-well voltage node 86.

The drive signals are derived from a logic circuit which is comprised of a NAND gate 94 and a NOR gate 96. The NOR gate 96 and one input thereof connected to an input node 98 having a signal GZ disposed thereon and the other input thereof connected to a node 100 having the signal "A" disposed thereon, the input driving signal. The NAND gate 94 has one input thereof connected to the node 100 and one input thereof connected to node 82, node 82 connected to the output of an inverter 102, the input thereof connected to the node 98. In a normal operational state, the signal GZ is low, such that the output of NOR gate 96 is controlled by the signal on line 100 and the node 82 will be high, such that the output of NAND gate 94 is also controlled by the signal on node 100. Node 100 therefore changes between logic "1" and logic "0" states, with the signals on output node 20 being in phase with this logic state, this being a conventional operation. During a hiZ operation, the signal on node 98 is raised high, forcing the output of NOR gate 96 low, turning off transistor 14 and forcing the output of NAND gate 94 high on node 26, turning off transistor 22. Node 82 also controls transistor 78, such that the normal operational mode will have transistor 78 conducting and it will not conduct in the hiZ state. In this state, the current source 76 will draw current from node 74.

When the buffer is active, the transistor 78 pulls the gate of transistor 28 on node 68 low through transistor 72. Transistor 72 is utilized as a protection device to reduce the stress on transistor 78. This is achieved similar to the manner in which transistor 16 protects transistor 14, i.e., the maximum voltage that can be disposed across transistor 72 is the difference between $V_{DD}$ and the voltage on node 20, whereas the gate of transistor 78 being pulled low does not see the same voltage on node 74, since node 74 must be one threshold voltage below $V_{DD}$. By maintaining node 68 low, when the voltage on node 26 is high, this will insure that the voltage on the gate of transistor 22 will not "droop," as was the case with the output buffer of FIG. 1. It therefore eliminates the output leakage current and through current spikes that existed in the prior art buffer wherein transistor 28 shut off when both nodes 26 and 20 were in logic "1" states.

The transistor 89 operates to insure that, even though node 20 is disposed at a logic "1," i.e., 3.3 volts, the well is clamped high to $V_{DD}$. This is due to the fact that node 68 is pulled low with transistor 66 turned off. The prior art system of FIG. 1 would allow transistor 36 (Q7) to turn off when the node 20 was high. By ensuring that the wells of the P-channel transistors are connected $V_{DD}$ for all voltage levels between ground and $V_{DD}$, the present invention eliminates substrate leakage current.

When the output goes into a hiZ state, transistor 78 is turned off, but current source 76 maintains current flow through node 74 to ground and through transistor 72. The current source 76 is basically fabricated from a long channel NMOS device, such that the current approaches zero as the drain-to-source voltage goes to zero. No static current is drawn as long as the voltage on node 20 is between $V_{DD}$ and ground. When the voltage on node 20 goes above $V_{DD}$, transistor 66 turns on, shutting off transistor 89 and transistor 28 by pulling their gate voltages to the voltage on node 20. However, current continues to be drawn through current source 76 from the node 20, the value of which is $I_1$. This current is specified, in one embodiment at 85 μA max.

In summary, the three primary distinctions between the embodiment of FIG. 2 and the prior art is, first, that transistor 28 is maintained in an active state when the output buffer is in a hiZ state and $V_{DD}$ is applied to the output node. The ensures that transistor 22, the driving transistor, is turned off to prevent any leakage current during the hiZ state. Second, the transistor 89 is added such that, when the output node is at 3.3 volts, a logic "1," the N-well bias is maintained at a finite voltage, unlike the prior art which only maintains it at a finite voltage when the output is at 5.0 volts or 0.0 volts. Third, since the transistor 28 is always in an active state, instead of having its gate tied to the output node 20, the current spike between a logic "1" to a logic "0" transition is reduced. This is due to the fact that transistor 22 has its gate disposed at ground if the NAND gate 94, which is a P-channel pre-driver, pulls the node 26 from a "low" to a "high," this voltage transition will also pull the gate of transistor 22 from a low to a high. Since transistor 66 is present and the gate of transistor 20 is not connected directly to node 20, transistor 20 is not off when the output on node 20 is high. As described above, if this were the case and the gate of transistor 28 were connected to node 20, this would require the N-channel transistors 14 and 16 to pull the node 20 low enough to turn on the transistor 28 with the gate connected to node 20 (the prior art system of FIG. 1) a sufficient amount before the gate of transistor 22 could be pulled high. During this period of time that node 20 is being pulled low to turn on transistor 28 (prior art of FIG. 1), current will be drawn through transistor 22.

Figure 3:
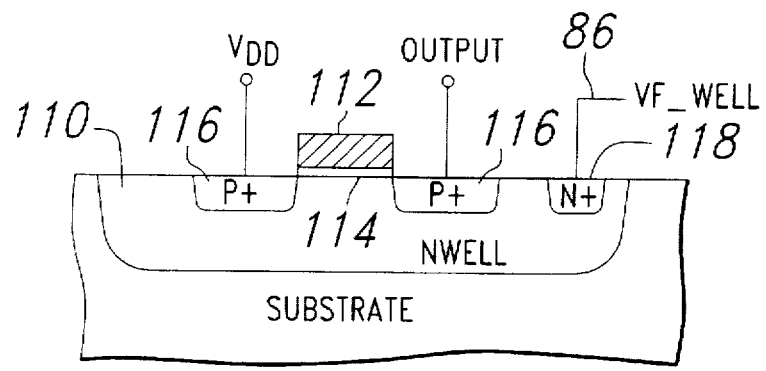
FIG. 3 illustrates a cross sectional diagram of a floating N-well transistor.

Referring now to FIG. 3, there is illustrated a cross-sectional view of a floating N-well. The N-well is typically formed in a P-type substrate by implanting and then driving N-type impurities into the substrate. This will form an N-well 110. Thereafter, a gate electrode 112 separated from the surface of the substrate by a gate oxide layer 114 will be formed in the well and then source/drain regions of P+ material will be formed to provide source/drain regions 116 and 118. Additionally, an N+ region 118 is formed in N-well 110. This is connected to the node 86.

In summary, there has been provided an output buffer that has an input and output, with the output being tolerant of overvoltage conditions. The output buffer is comprised of conventional output driver transistors comprised of a pull-up transistor and a pull-down transistor. The pull-up transistor has a driving circuit therewith that ensures the pull-up transistor will be completely turned off during all hiZ condition and, that during normal operations, will be operated such as not to allow unnecessary current to be pulled therethrough during a transition from a high to a low. The P-channel transistors in the output buffer are floating well-type transistors with the well thereof connected to a switched well voltage. This switched well voltage is connected to the supply voltage during normal operation and to the output node during overvoltage conditions. Additionally, the N-well voltage is maintained at the supply voltage during all transitions on the output that are not an overvoltage condition.

Although the preferred embodiment has been described in detail, it should be understood that various changes, substitutions and alterations can be made therein without departing from the spirit and scope of the invention as defined by the appended claims.

What is claimed is:

1. An output buffer having a input terminal and an output terminal operating at a first supply voltage level, and the output terminal capable of tolerating voltages at a second and higher supply voltage level, comprising:

a positive power supply rail connected to the first supply voltage;

a negative power supply rail connected to a ground reference voltage;

a pull-down transistor having a source/drain and gate and of a first conductivity type for sinking current from the output terminal to the negative power supply rail through the source/drain path thereof in response to a first logic state on the input terminal;

a pull-up transistor having a source/drain and gate and of a second conductivity type opposite to a first conductivity type for sourcing current from said positive power supply rail to the output terminal through the source/drain path thereof in response to a second logic state on the input terminal;

input logic circuitry connected to the input terminal for generating a high driving signal for controlling the gate of said pull-up transistor and a low driving signal for controlling the gate of said pull-down transistor, said input logic circuitry operating in a normal operating mode to generate said high driving signal and said low driving signal to change the logic state of the output terminal between a voltage level substantially equal to the ground reference voltage and a voltage level substantially equal to the first supply voltage;

a pass gate for connecting said high driving signal to the gate of said pull-up transistor during a conductive mode thereof and for inhibiting said high driving signal from being applied to the gate of said pull-up transistor during a nonconductive mode, said pass gate including at least a pass gate transistor having a source/drain and gate of said second conductivity type with the source/drain thereof connected in series between said input logic circuitry and the gate of said pull-up transistor to selectively connect the high driving signal thereto, the gate of pass gate transistor connected to said pass gate control circuitry;

a pass gate control circuit for controlling said pass gate to operate in the conductive mode when the voltage on the output terminal is at or between the ground reference voltage and the first supply voltage, wherein said pass gate control circuitry includes a switch for connecting the gate of said pass gate transistor to said negative power supply rail; and overvoltage circuitry for pulling the gate of said pull-up transistor to substantially the second supply voltage level when the output terminal is in an overvoltage condition, and said pass gate control circuit for controlling said pass gate to be in a nonconductive mode during said overvoltage condition, such that said pull-up transistor is nonconductive during said overvoltage condition.

2. An output buffer having a input terminal and an output terminal operating at a first supply voltage level, and the output terminal capable of tolerating voltages at a second and higher supply voltage level, comprising:

a positive power supply rail connected to the first supply voltage;

a negative power supply rail connected to a ground reference voltage;

a pull-down transistor having a source/drain and gate and of a first conductivity type for sinking current from the output terminal to the negative power supply rail through the source/drain path thereof in response to a first logic state on the input terminal;

a pull-up transistor having a source/drain and gate and of a second conductivity type opposite to a first conductivity type for sourcing current from said positive power supply rail to the output terminal through the source/drain path thereof in response to a second logic state on the input terminal;

input logic circuitry connected to the input terminal for generating a high driving signal for controlling the gate of said pull-up transistor and a low driving signal for controlling the gate of said pull-down transistor said input logic circuitry operating in a normal operating mode to generate said high driving signal and said low driving signal to change the logic state of the output terminal between a voltage level substantially equal to the ground reference voltage and a voltage level substantially equal to the first supply voltage;

a pass gate for connecting said high driving signal to the gate of said pull-up transistor during a conductive mode thereof and for inhibiting said high driving signal from being applied to the gate of said pull-up transistor during a nonconductive mode, said pass gate including at least a pass gate transistor having a source/drain and gate of said second conductivity type with the source/drain thereof connected in series between said input logic circuitry and the gate of said pull-up transistor to selectively connect the high driving signal thereto, the gate of pass gate transistor connected to said pass gate control circuitry;

a pass gate control circuit for controlling said pass gate to operate in the conductive mode when the voltage on the output terminal is at or between the ground reference voltage and the first supply voltage, overvoltage circuitry for pulling the gate of said pull-up transistor to substantially the second supply voltage level when the output terminal is in an overvoltage condition, and said pass gate control circuit for controlling said pass gate to be in a nonconductive mode during said overvoltage condition, such that said pull-up transistor is nonconductive during said overvoltage condition, said overvoltage circuitry including:

a first overvoltage transistor having a source/drain and gate of said second conductivity type, the source/drain thereof connected between said pull-up transistor and the output terminal and the gate of said first transistor connected to said positive power supply rail; and a second overvoltage transistor having a source/drain and gate of the second conductivity type with the source/drain thereof connected between the gate of said pass gate transistor and the output terminal and the gate thereof connected to said positive power supply rail;

wherein said first and second overvoltage transistors will be conductive during an overvoltage condition; and wherein said pull-up transistor, said pass gate transistor and said first and second overvoltage transistors comprise P-channel transistors that have a floating N-well and further comprising an N-well switching device for switching the voltage applied to said N-well for each of said P-channel transistors to either the first supply voltage level or the second supply voltage level, with said first supply voltage level switched to during all voltages on the output between the ground reference voltage level and the first supply voltage level and the second supply voltage switched to only during an overvoltage condition.

* * * * *